(12) United States Patent
Aoki et al.

(10) Patent No.: US 8,518,512 B2
(45) Date of Patent: Aug. 27, 2013

(54) PRODUCTION METHOD FOR OPTICAL DISC MASTER, OPTICAL DISC MASTER, STAMPER, AND OPTICAL DISC

(75) Inventors: Tadahisa Aoki, Shizuoka (JP); Katsunori Takeuchi, Saitama (JP)

(73) Assignee: Sony Disc & Digital Solutions Inc., Tokyo (JP)

( * ) Notice: Subject to any disclaimer, the term of this patent is extended or adjusted under 35 U.S.C. 154(b) by 974 days.

(21) Appl. No.: 12/567,099

(22) Filed: Sep. 25, 2009

(65) Prior Publication Data
US 2010/0119763 A1    May 13, 2010

(30) Foreign Application Priority Data

Nov. 13, 2008   (JP) ................. 2008-291452

(51) Int. Cl.
*G11B 7/24* (2006.01)
(52) U.S. Cl.
USPC ............. 428/64.1; 428/64.4; 430/270.11
(58) Field of Classification Search
USPC ................... 428/64.4; 430/270.11
See application file for complete search history.

(56) References Cited

U.S. PATENT DOCUMENTS

2005/0128926 A1* 6/2005 Kai et al. ............. 369/125

FOREIGN PATENT DOCUMENTS

| JP | 2006-185529 | 7/2006 |
| JP | 2008-47252 | 2/2008 |
| WO | WO 2008/088076 A1 | 7/2008 |

OTHER PUBLICATIONS

Office Action issued Sep. 14, 2010, in Japanese Patent Application No. 2008-291452.

* cited by examiner

*Primary Examiner* — Elizabeth Mulvaney
(74) *Attorney, Agent, or Firm* — Oblon, Spivak, McClelland, Maier & Neustadt, L.L.P.

(57) ABSTRACT

A production method for an optical disc master includes the steps of: preparing a substrate; forming an intermediate layer having a predetermined thickness on the substrate; forming an inorganic resist layer having a thickness on the intermediate layer, a ratio of the thickness of the intermediate layer to the thickness of the inorganic resist layer being in a range between 0.8:1 and 1.5:1; irradiating the inorganic resist layer with a laser beam to selectively expose the inorganic resist layer; and developing the selectively exposed inorganic resist layer.

13 Claims, 7 Drawing Sheets

PRODUCTION METHOD FOR OPTICAL DISC MASTER, OPTICAL DISC MASTER, STAMPER, AND OPTICAL DISC

BACKGROUND OF THE INVENTION

1. Field of the Invention

The present invention relates to a production method for an optical disc master which uses an inorganic resist. The present invention also relates to an optical disc master, a stamper, and an optical disc obtained as a result of the production method.

2. Description of the Related Art

Various formats of optical discs for various uses such as CD and DVD formats are proposed in the related art. Optical disc substrates for use in any format are generally formed by injection molding of a resin material. A concave-convex pattern including pits and grooves is formed on the surface of an optical disc substrate.

The concave-convex pattern formed on the optical disc substrate represents an information signal. An optical information storage medium with a high capacity is obtainable by miniaturizing and densifying the concave-convex pattern.

Such a concave-convex pattern formed on an optical disc substrate is formed by transferring a concave-convex pattern formed on an optical disc master to the optical disc substrate. A common method for forming an optical disc master for use in the production of DVDs is described below with reference to FIGS. 6 and 7.

Figure 6A:
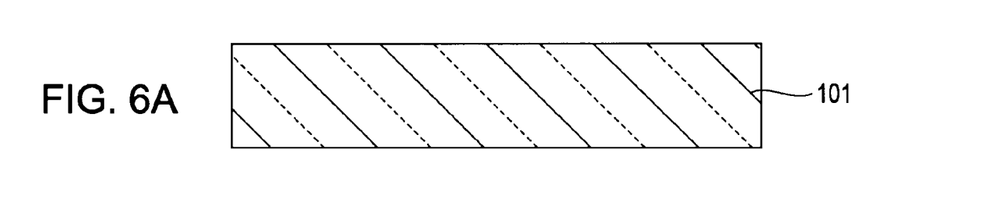
FIG. 6A shows a first step of a production method for an optical disc according to the related art.
Figure 6B:
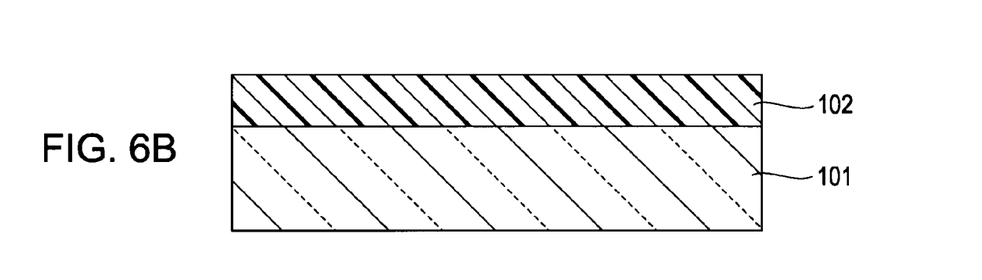
FIG. 6B shows a second step of the production method for an optical disc according to the related art.

First, as shown in FIG. 6A, a glass substrate 101 with a sufficiently smoothed surface is prepared. Then, as shown in FIG. 6B, a photosensitive organic resist layer 102 is formed on the glass substrate 101. The organic resist layer 102 is formed by placing the glass substrate 101 on a rotary table (not shown) and applying an organic resist material to the entire surface of the glass substrate 101 while rotating the rotary base at a predetermined rotational speed.

Figure 6C:
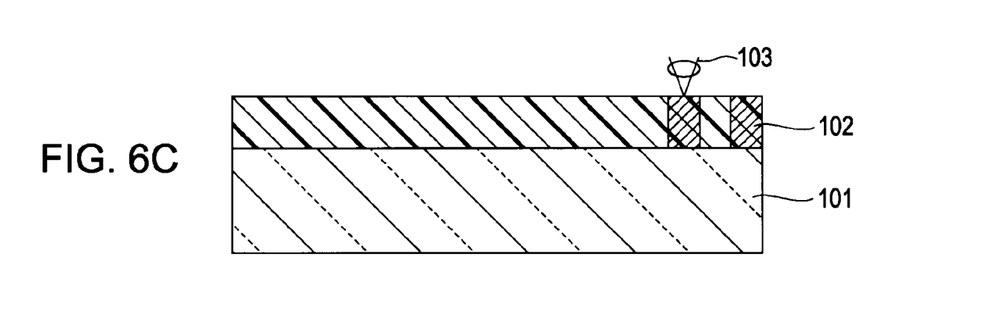
FIG. 6C shows a third step of the production method for an optical disc according to the related art.

Then, as shown in FIG. 6C, the organic resist layer 102 is exposed to an exposure laser beam 103 in a desired pattern including pits and grooves. A portion of the organic resist layer 102 that corresponds to the spot diameter of the laser beam 103 is exposed through a photochemical reaction induced by the laser beam 103.

Figure 6D:
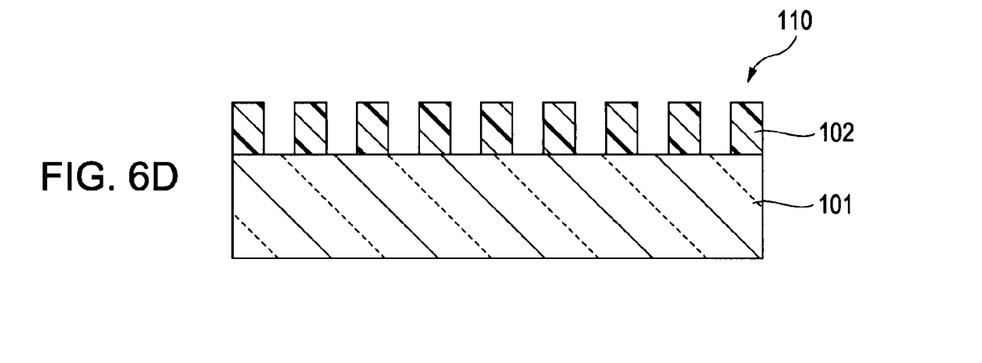
FIG. 6D shows a fourth step of the production method for an optical disc according to the related art.

Then, the resulting organic resist layer 102 is developed using a developing solution, and an exposed portion or an unexposed portion of the organic resist layer 102 is removed using a chemical solution. In this way, as shown in FIG. 6D, an optical disc master 110 with the organic resist layer 102 formed in a predetermined concave-convex pattern on the glass substrate 101 is obtained.

The minimum pit length (spot diameter) P that may be achieved with the photosensitive organic resist layer 102 in the exposure and development steps discussed above is determined by the following formula:

$$P = K \times \lambda / NA$$

In the formula, $\lambda$ represents the wavelength of the laser beam 103 used for exposure, NA represents the numerical aperture of an objective lens for converging a luminous flux emitted from a light source on the organic resist layer 102, and K represents a proportionality constant determined by the combination of the wavelength of the laser beam 103 used and the material of the organic resist layer 102, which generally may be about 0.5 to 0.8. If it is assumed in the example that K is 0.87, the wavelength $\lambda$ of the laser beam 103 used is 413 nm, and NA is 0.9, the minimum pit length (spot diameter) P is about 0.87×413/0.9=399 nm.

Figure 7E:
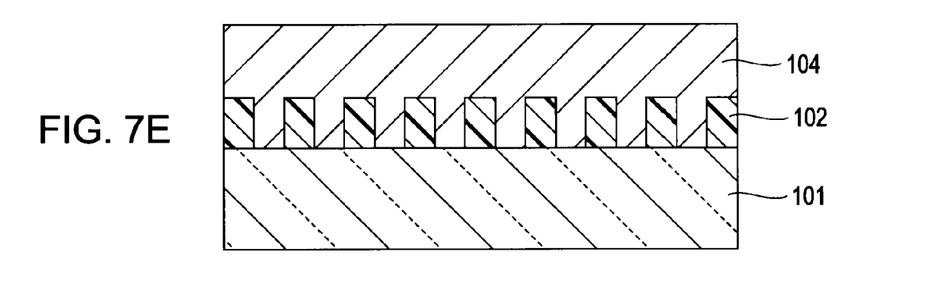
FIG. 7E shows a fifth step of the production method for an optical disc according to the related art.
Figure 7F:
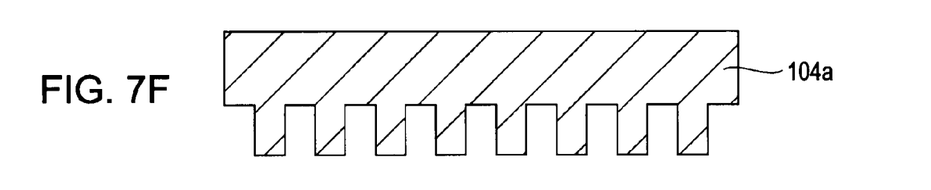
FIG. 7F shows a sixth step of the production method for an optical disc according to the related art.

Then, as shown in FIG. 7E, a metallic nickel film 104 is deposited over the surface of the concave-convex pattern of the optical disc master 110 by electroforming. Then, the metallic nickel film 104 is peeled from the optical disc master 110 and undergoes a predetermined process, completing a stamper 104a shown in FIG. 7F.

Figure 7G:
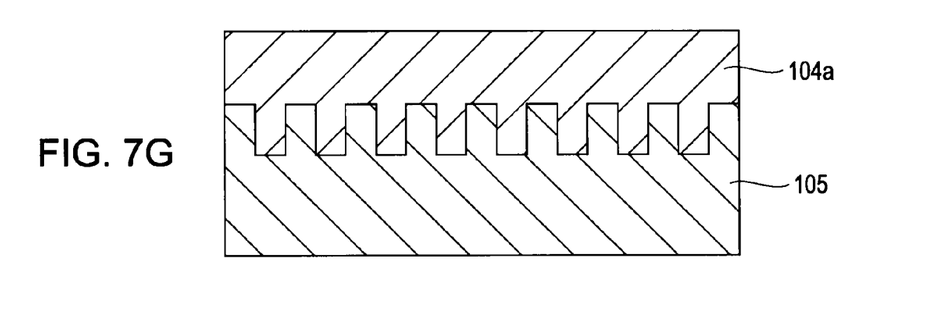
FIG. 7G shows a seventh step of the production method for an optical disc according to the related art.
Figure 7H:
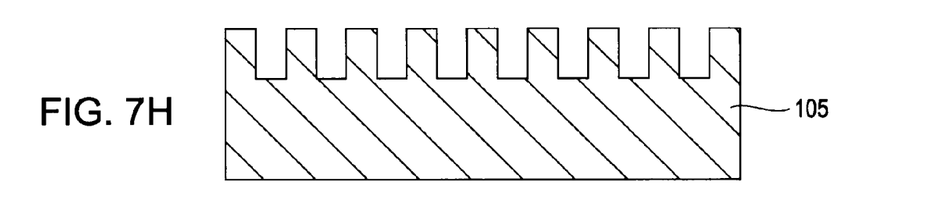
FIG. 7H shows an eighth step of the production method for an optical disc according to the related art.

With the thus formed stamper 104a disposed in a cavity of an injection molding apparatus, injection molding is performed using polycarbonate which is a thermosetting resin as shown in FIG. 7G. Consequently, as shown in FIG. 7H, an optical disc substrate 105 to which the concave-convex pattern formed on the stamper 104a has been transferred is formed.

An optical disc master on which a series of pits with a minimum pit length of 0.4 μm and a track pitch of 0.74 μm are formed is formed by the method for forming an optical disc master. The optical disc master 110 is used to produce read-only DVDs (DVD-ROMs), for example. DVDs produced using the thus configured optical disc master 110 have an information storage capacity of 4.7 GB for one side of an optical disc with a diameter of 12 cm.

In a concave-convex pattern on an optical disc master formed through a photochemical reaction using an organic resist layer, however, side surfaces of grooves in the concave-convex pattern may be widened more than desired or may not be formed to be smooth. In the case where the concave-convex pattern includes a sharply bent groove, the corner of the sharply bent portion may be formed not in a predetermined shape but to be more or less rounded. If the concave-convex pattern is not formed in a desired shape, a sufficient margin may not be secured, for example, in the case of densifying the concave-convex pattern to fabricate a high-capacity optical disc.

In recent years, high-density optical discs conforming to a Blu-ray Disc (registered trademark, hereinafter referred to as "BD") standard have been becoming more common. An optical disc conforming to the BD standard has a storage capacity of approximately 25 GB for a single side of a single-layered disc and a storage capacity of approximately 50 GB for a single side of a double-layered disc. In order for a single side of an optical disc with a diameter of 12 cm to have an information storage capacity of 25 GB, it is necessary that the minimum pit length and the track pitch be reduced to about 0.17 μm and 0.32 μm, respectively.

With this in view, in order to form an optical disc master for BDs by the method for forming an optical disc master according to the related art discussed above, it is necessary to use a light source that emits a laser beam with a wavelength $\lambda$ of 180 nm in the case where the proportionality constant K is fixed and NA is 0.95, for example. That is, an exposure apparatus for forming an optical disc master for DVDs may not be used as it is. The wavelength of 180 nm is shorter than the wavelength of an ArF laser, 193 nm. The ArF laser is being developed as a light source for next-generation semiconductor lithography. An exposure apparatus that uses such a short-wavelength beam employs special optical components such as lenses besides the laser-emitting light source and may be very expensive.

Japanese Unexamined Patent Application Publication No. 2006-185529 (JP-A-2006-185529) discloses an exposure apparatus for both forming a high-density optical disc master conforming to the BD standard and forming a low-density optical disc master for DVDs, for example, which have a storage density lower than that conforming to the BD standard. In the exposure apparatus according to JP-A-2006-185529, a spot-forming optical element is disposed in an optical path of an exposure laser beam to irradiate a resist layer with the laser beam with a desired spot diameter for exposure of the resist layer. Adjusting the spot diameter allows the same exposure apparatus to form both an optical disc master for BDs and an optical disc master for DVDs.

In the exposure apparatus according to JP-A-2006-185529, however, it is necessary to provide a spot-forming optical element in the optical path of the exposure laser beam of the exposure apparatus. Moreover, an operation for varying the spot diameter is troublesome.

SUMMARY OF THE INVENTION

It is therefore desirable to provide a production method for an optical disc master conforming to various standards that has a concave-convex pattern with improved precision. It is also desirable to provide such an optical disc master, a stamper, and an optical disc produced using the optical disc master.

According to an embodiment of the present invention, there is provided a production method for an optical disc master, including: preparing a substrate; forming an intermediate layer having a predetermined thickness on the substrate; forming an inorganic resist layer having a thickness on the intermediate layer, a ratio of the thickness of the intermediate layer to the thickness of the inorganic resist layer being in a range between 0.8:1 and 1.5:1; irradiating the inorganic resist layer with a laser beam to selectively expose the inorganic resist layer; and developing the selectively exposed inorganic resist layer.

In the production method for an optical disc master according to the embodiment of the present invention, the thickness of the inorganic resist layer corresponds to the depth of the concave-convex pattern, which includes pits and grooves, to be formed on the optical disc master to be produced. The intermediate layer serves as a heat storage layer.

In the production method for an optical disc master according to the embodiment of the present invention, the ratio of the thickness of the intermediate layer to the thickness of the inorganic resist layer is in the range between 0.8:1 and 1.5:1. Thus, lines with a desired width are formed in a portion of the inorganic resist layer that is exposed to the laser beam irradiation.

According to an embodiment of the present invention, there is provided an optical disc master having a concave-convex pattern formed by the steps of: forming an intermediate layer having a predetermined thickness on a substrate; forming an inorganic resist layer having a thickness on the intermediate layer, a ratio of the thickness of the intermediate layer to the thickness of the inorganic resist layer being in a range between 0.8:1 and 1.5:1; irradiating the inorganic resist layer with a laser beam to selectively expose the inorganic resist layer; and developing the selectively exposed inorganic resist layer.

In the optical disc master according to the embodiment of the present invention, the concave-convex pattern is formed by exposing and developing the inorganic resist layer. Thus, the concave-convex pattern is formed precisely with the boundary between an exposed portion and an unexposed portion clearly defined.

According to an embodiment of the present invention, there is provided a stamper formed using the optical disc master discussed above. That is, the stamper according to the embodiment of the present invention is formed by forming a film of a stamper material on the concave-convex pattern of the optical disc master, and peeling the stamper material to which the concave-convex pattern has been transferred from the optical disc master.

According to an embodiment of the present invention, there is provided an optical disc formed using the stamper discussed above. That is, the optical disc according to the embodiment of the present invention is formed by transferring the concave-convex pattern formed on the stamper to a disc substrate.

The stamper according to the embodiment of the present invention is formed using an optical disc master having a concave-convex pattern that is formed by exposing and developing the inorganic resist layer and that is thus formed precisely with the boundary between an exposed portion and an unexposed portion clearly defined. In the stamper according to the embodiment of the present invention, consequently, pits and grooves are formed precisely.

In the optical disc according to the embodiment of the present invention, which is formed using the stamper, pits and grooves are formed precisely.

According to an embodiment of the present invention, it is possible to form an optical disc master, a stamper, and an optical disc having a precise concave-convex pattern using an inorganic resist layer. With the ratio of the thickness of the intermediate layer to the thickness of the inorganic resist layer being between 0.8:1 and 1.5:1, it is possible to fabricate an optical disc master, a stamper, and an optical disc conforming to various standards with the same exposure apparatus.

DESCRIPTION OF THE PREFERRED EMBODIMENTS

An embodiment of the present invention will be described below with reference to the drawings.

A description is made of a method for producing an optical disc master and a method for producing an optical disc using the optical disc master according to an embodiment of the present invention with reference to FIGS. 1 to 4.

In the description below, an optical disc master specifically for use in the production of BDs on which pits and grooves are formed at a high density is referred to as a "high-density optical disc master". Also, an optical disc master specifically for use in the production of DVDs or CDs on which pits and grooves are formed at a low density is referred to as a "low-density optical disc master".

Figure 1A:
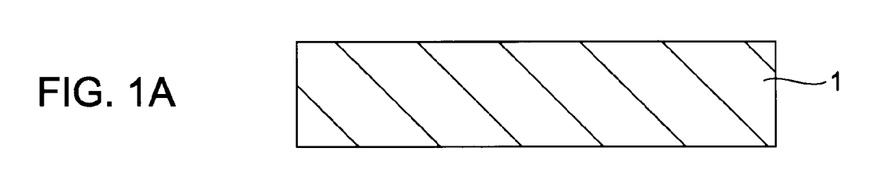
FIG. 1A shows a first step of a production method for an optical disc master and an optical disc according to an embodiment of the present invention.

First, as shown in FIG. 1A, a substrate 1 with a smooth surface is prepared. The substrate 1 may be made of glass, silicon, or plastic (polycarbonate), for example. In the embodiment, a silicon substrate is used as the substrate 1. In the case where a silicon substrate is used, a pre-treatment step which includes a washing step is simplified and the number of steps is reduced compared to the case where a glass substrate or a plastic substrate is used.

Figure 1B:
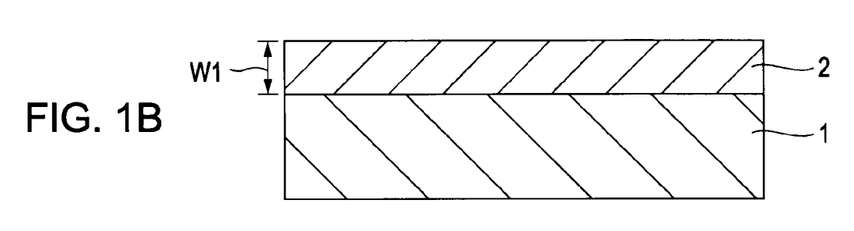
FIG. 1B shows a second step of the production method for an optical disc master and an optical disc according to the embodiment of the present invention.
Figure 1C:
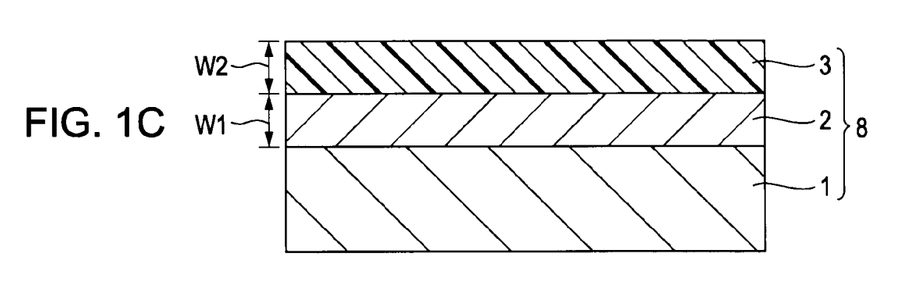
FIG. 1C shows a third step of the production method for an optical disc master and an optical disc according to the embodiment of the present invention.

Then, as shown in FIG. 1B, an intermediate layer 2 made of amorphous silicon is formed on the substrate 1 by a sputtering method or other vapor deposition methods. Subsequently, as shown in FIG. 1C, an inorganic resist layer 3 is formed. The inorganic resist layer 3 is formed to have a thickness in a range of 50 nm to 150 nm. The thickness of the inorganic resist layer 3 is determined depending on whether a high-density optical disc master is to be formed or a low-density optical disc master is to be formed.

The intermediate layer 2 is formed to provide a layer with a low thermal conductivity on the substrate 1. The intermediate layer 2 is also formed to provide an optimum heat storage effect. The ratio W1:W2 of the thickness W1 of the intermediate layer 2 to the thickness W2 of the inorganic resist layer 3 is determined to be between 0.8:1 and 1.5:1. Preferably, the ratio W1:W2 is determined to be between 0.8:1 and 1.2:1 in the case of forming a high-density optical disc master conforming to the BD standard, and to be between 1.1:1 and 1.5:1 in the case of forming a low-density optical disc master for use in the production of DVDs or CDs on which pits and grooves are formed at a low density.

In the case of forming a high-density optical disc master conforming to the BD standard in the embodiment, for example, the inorganic resist layer 3 is formed to have a thickness W2 of approximately 70 nm in the step shown in FIG. 1C. Therefore, the intermediate layer 2 is formed to have a thickness W1 of 56 nm to 84 nm, for example, in order for the ratio W1:W2 to be between 0.8:1 and 1.2:1.

In the case of forming a low-density optical disc master, the inorganic resist layer 3 is formed to have a thickness W2 of about 90 nm to 150 nm, which is greater than the thickness W2 of the inorganic resist layer 3 suitable for forming a high-density optical disc master, in the step shown in FIG. 1C. Therefore, if the inorganic resist layer 3 is formed to have a thickness W2 of 130 nm, for example, the intermediate layer 2 is formed to have a thickness W1 of 143 nm to 195 nm, for example, in order for the ratio W1:W2 to be between 1.1:1 and 1.5:1.

The preferable ratio of the thickness W1 of the intermediate layer 2 to the thickness W2 of the inorganic resist layer 3 is relevant to the heat storage amount necessary for exposure, and is determined appropriately.

In the case of forming a high-density optical disc master conforming to the BD standard, the heat storage amount necessary for exposure may not be obtained if the thickness W1 of the intermediate layer 2 is smaller than 0.8 times the thickness W2 of the inorganic resist layer 3. If the thickness W1 of the intermediate layer 2 is greater than 1.2 times the thickness W2 of the inorganic resist layer 3, meanwhile, the heat storage amount may be more than necessary for exposure, excessively increasing the pit size.

Likewise, in the case of forming a low-density optical disc master conforming to the CD or DVD standard, the heat storage amount necessary for exposure may not be obtained if the thickness W1 of the intermediate layer 2 is smaller than 1.1 times the thickness W2 of the inorganic resist layer 3. If the thickness W1 of the intermediate layer 2 is greater than 1.5 times the thickness W2 of the inorganic resist layer 3, meanwhile, it may take much time to form the intermediate layer 2, and the heat storage amount may be more than necessary for exposure, excessively increasing the pit size.

In the case where the same optical system is used, the thickness W1 of the intermediate layer 2 for a low-density optical disc master is set to be greater than the thickness W1 of the intermediate layer 2 for a high-density optical disc master. This is because a low-density optical disc master has a greater pit size and thus the intermediate layer 2 should provide a greater heat storage effect for a low-density optical disc master than for a high-density optical disc master.

The inorganic resist layer 3 is formed uniformly on the intermediate layer 2 by a sputtering method or other vapor deposition method in the step shown in FIG. 1C, and made of a predetermined inorganic resist material. Examples of the inorganic resist material for forming the inorganic resist layer 3 include Ti, V, Cr, Mn, Fe, Nb, Cu, Ni, Co, Mo, Ta, W, Zr, Ru, and Ag. Among these, Mo, W, Cr, Fe, and Nb are preferred. In the embodiment, sputtering is performed using Mo and W as inorganic resist materials while introducing argon (Ar) and oxygen ($O_2$) as sputtering gases. In this way, the inorganic resist layer 3 made of a product of incomplete oxidation of W and Mo is formed.

The inorganic resist layer 3 is formed to have a thickness corresponding to the depth of grooves in the concave-convex pattern of the optical disc master to be formed. Therefore, the inorganic resist layer 3 is formed to have a thickness of about 50 nm to 90 nm in the case of forming a high-density optical disc master, and to have a thickness of 90 nm to 150 nm in the case of forming a low-density optical disc master.

Figure 4:
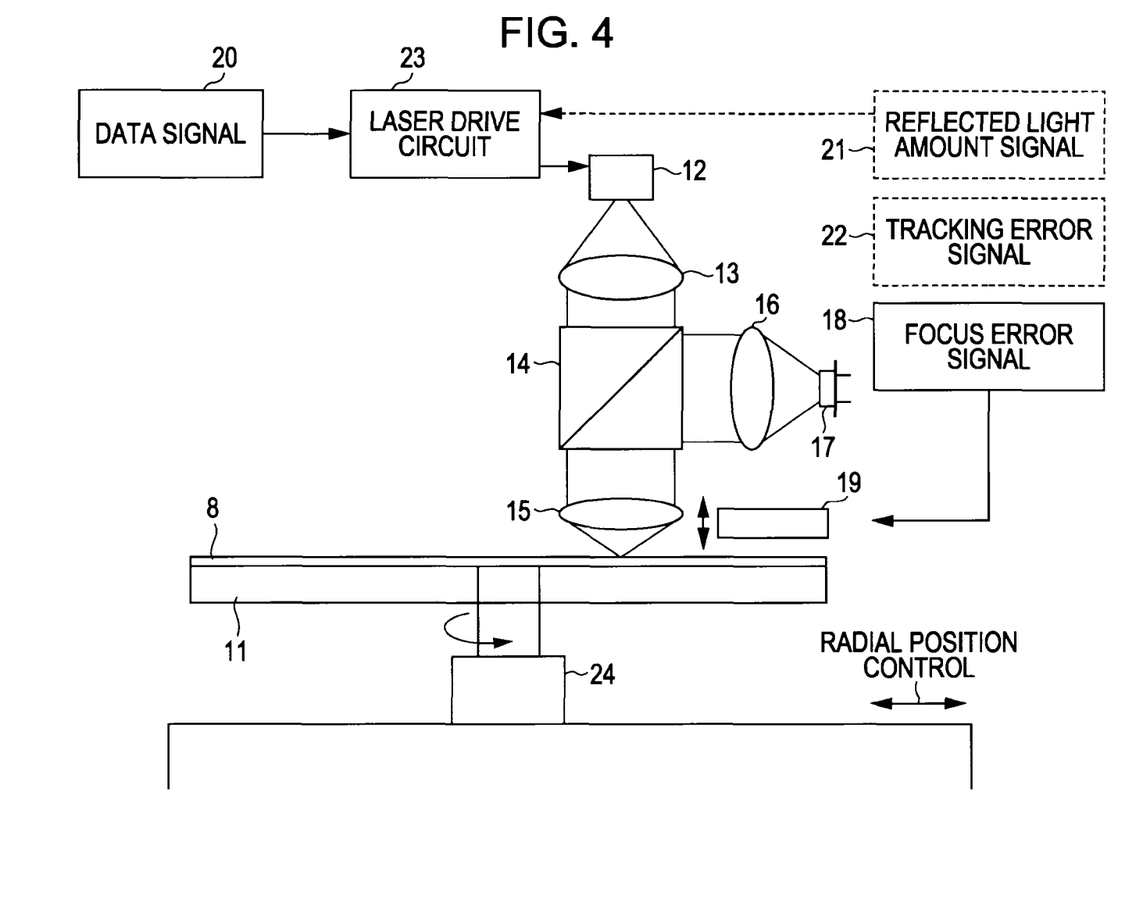
FIG. 4 shows a schematic configuration of an exposure apparatus for use in the production method for an optical disc master and an optical disc according to the embodiment of the present invention.

Then, the substrate 1 on which the inorganic resist layer 3 is formed (hereinafter referred to as "resist substrate 8") is set onto a turntable of an exposure apparatus shown in FIG. 4 with the inorganic resist layer 3 facing upward. FIG. 4 shows a schematic configuration of the exposure apparatus for use in the embodiment. The exposure apparatus includes a beam generation source 12 for generating a laser beam for exposure of the inorganic resist layer 3, and a collimator lens 13, a beam splitter 14, and an objective lens 15 through which the laser beam emitted from the beam generation source 12 passes. The laser beam emitted from the beam generation source 12 is directed to and focused on the inorganic resist layer 3 of the resist substrate 8 through the lens system. In the exposure apparatus, the beam reflected from the resist substrate 8 passes through the beam splitter 14 and a condenser lens 16 to be focused on a split photodetector 17. The split photodetector 17 detects the beam reflected from the resist substrate 8, generates a focus error signal 18 on the basis of the detection results, and feeds the focus error signal 18 to a focus actuator 19. The focus actuator 19 controls the position of the objective lens 15 in the height direction.

The turntable 11 includes a feeding mechanism for precisely changing a portion of the resist substrate 8 to be exposed.

In the exposure apparatus, also, a laser drive circuit 23 controls the beam generation source 12 for exposure or focusing on the basis of a data signal 20, a reflected light amount signal 21, and a tracking error signal 22. A spindle motor control system 24 is mounted on the central shaft of the turntable 11 to control a spindle motor to an optimum rotational speed on the basis of the radial position of the optical system and the desired linear speed.

In the embodiment, the beam generation source 12 is preferably configured to emit a laser beam with a short wavelength. Specifically, the beam generation source 12 is configured to emit a blue semiconductor laser beam with a wavelength of 405 nm. The beam generation source 12 is turned on and off in accordance with a recording signal. The action of "turning off the beam generation source 12" means reducing the intensity of the laser beam to such a level that no pit is formed in the inorganic resist layer 3 by thermal recording.

In the exposure step described above, as shown in FIG. 2D, exposed portions 3a and unexposed portions 3b are formed by irradiating desired portions of the inorganic resist layer 3 with a laser beam L. An exposure pattern for forming pits and grooves in an optical disc master is thus formed.

Figure 2D:
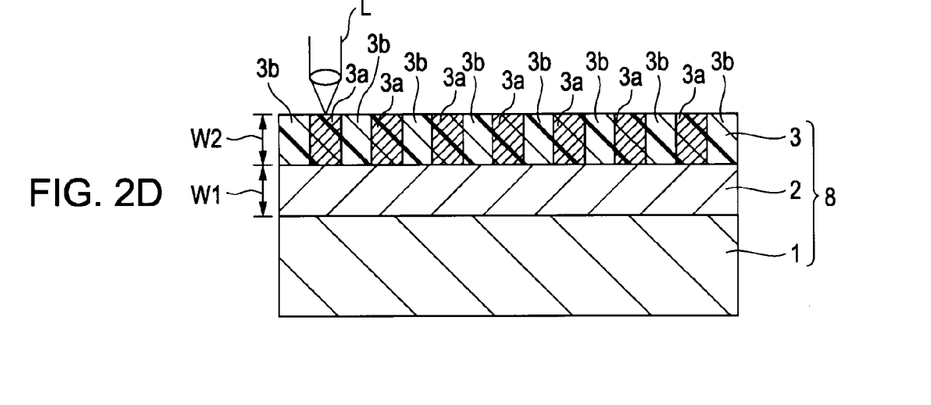
FIG. 2D shows a fourth step of the production method for an optical disc master and an optical disc according to the embodiment of the present invention.
Figure 2E:
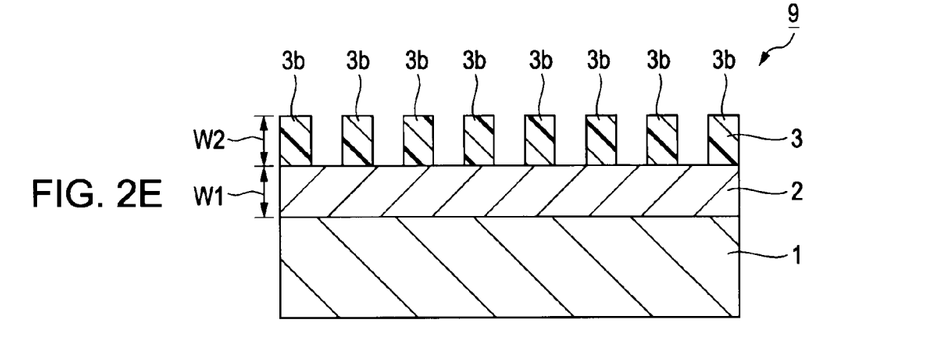
FIG. 2E shows a fifth step of the production method for an optical disc master and an optical disc according to the embodiment of the present invention.

In the embodiment, the intermediate layer 2 which is capable of storing heat of the laser beam L is formed below the inorganic resist layer 3. That is, it is possible to vary the amount of heat to be stored in the intermediate layer 2 by varying the thickness W1 of the intermediate layer 2, and it is thus possible to increase the width of lines in the exposure pattern to be formed on the inorganic resist layer 3 by increasing the thickness W1 of the intermediate layer 2 and hence the amount of heat to be stored in the intermediate layer 2.

In the case of forming a low-density optical disc master, as discussed above, the inorganic resist layer 3 is formed to have a thickness of 90 nm to 150 nm, and the intermediate layer 2 is formed such that the ratio W1:W2 of the thickness W1 of the intermediate layer 2 to the thickness W2 of the inorganic resist layer 3 is between 1.1:1 and 1.5:1. This allows the intermediate layer 2 to be thicker than that for the fabrication of a high-density optical disc master, allowing an exposure apparatus that is employed to form a high-density optical disc master to form a pattern suitable for forming a low-density optical disc master on the inorganic resist layer 3. In the case where the inorganic resist layer 3 is irradiated with the laser beam L with a wavelength of 405 nm, an exposure pattern having lines with a width necessary for high-density optical discs is formed in the related art. In the embodiment, it is possible to increase the amount of heat of the laser beam L to be stored in the intermediate layer 2 by increasing the thickness W1 of the intermediate layer 2 in correspondence with the thickness W2 of the inorganic resist layer 3. This allows increasing the range of the inorganic resist layer 3 to be thermally recorded, and thus allows forming an exposure pattern having lines with a width suitable for low-density optical discs.

In the case of forming a high-density optical disc master, meanwhile, the inorganic resist layer 3 is formed to have a thickness of 50 nm to 90 nm, and the intermediate layer 2 is formed such that the ratio W1:W2 of the thickness W1 of the intermediate layer 2 to the thickness W2 of the inorganic resist layer 3 is between 0.8:1 and 1.2:1. In this way, the inorganic resist layer 3 is exposed so as to have a miniature pattern with a minimum pit length of 0.17 μm and a track pitch of 0.32 μm formed thereon. In an exposure step according to the related art, exposure is performed on an organic resist layer through a photochemical reaction using a laser beam, and thus it has been difficult to form a high-density optical disc master using a laser beam with a wavelength of 405 nm.

In the embodiment, exposure is performed on the inorganic resist layer 3 made of an inorganic material through thermal recording using the laser beam L, enabling exposure with a spot diameter that is smaller than that in the case of the exposure on an organic resist layer through a photochemical reaction according to the related art. With the ratio W1:W2 of the thickness W1 of the intermediate layer 2 to the thickness W2 of the inorganic resist layer 3 being between 0.8:1 and 1.2:1, in addition, it is possible to form a miniature exposure pattern suitable for a high-density optical disc master on the inorganic resist layer 3.

In the embodiment, not only the thickness W2 of the inorganic resist layer 3, which determines the depth of pits and grooves to be formed, but also the thickness W1 of the intermediate layer 2 is varied depending on whether a high-density optical disc master is to be formed or a low-density optical disc master is to be formed. In this way, the width of lines in an exposure pattern to be formed on the inorganic resist layer 3 is varied appropriately. In the exposure step according to the embodiment, moreover, it is not necessary to change the wavelength and the spot diameter of the laser beam L depending on whether a high-density optical disc master is to be formed or a low-density optical disc master is to be formed. That is, it is possible to fabricate a high-density optical disc master for high-density optical discs, such as BDs and higher-density discs, and a low-density optical disc master for low-density optical discs, such as DVDs and CDs, with the same exposure apparatus. It is also not necessary to change the specifications of the exposure apparatus and the material of the resist substrate 8. That is, exposure is performed without changing the laser wavelength or the optical system, that is, with the same type of laser beam and the same laser spot diameter.

Figure 5A:
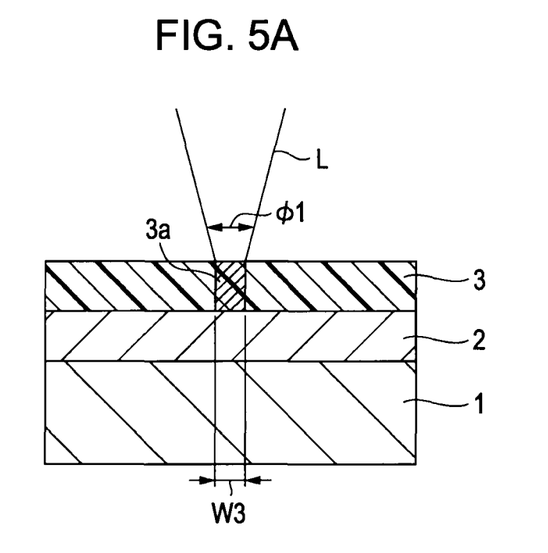
FIG. 5A shows an exemplary exposure step in the production method for an optical disc master according to the embodiment of the present invention, showing a case of forming a high-density optical disc master.
Figure 5B:
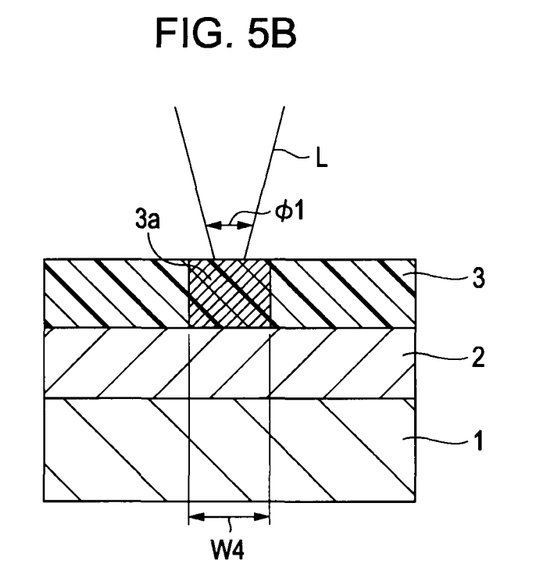
FIG. 5B shows an exemplary exposure step in the production method for an optical disc master according to the embodiment of the present invention, showing a case of forming a low-density optical disc master.

FIG. 5A schematically shows an exposure step according to the embodiment, showing a case of forming a high-density optical disc master. FIG. 5B schematically shows an exposure step according to the embodiment, showing a case of forming a low-density optical disc master. As shown in FIGS. 5A and 5B, the intermediate layer 2 and the inorganic resist layer 3 are formed to be thinner in the case of forming a high-density optical disc master than in the case of forming a low-density optical disc master. Each inorganic resist layer 3 is irradiated with a laser beam L with the same wavelength of e.g. 405 nm and the same spot diameter of φ1. Then, as shown in FIGS. 5A and 5B, an exposed portion 3a with different widths is formed in the inorganic resist layer 3 for the same wavelength and the same spot diameter of φ1. That is, the width W4 of the exposed portion 3a for forming a low-density optical disc master is greater than the width W3 of the exposed portion 3a for forming a high-density optical disc master because of the difference in the heat storage amount of the intermediate layer 2.

Then, the resist substrate 8 which has undergone the exposure step discussed above is developed through a wet process using an alkali developing solution. The development method may be a dipping method in which the resist substrate 8 is immersed in the alkali developing solution or a method in which the alkali developing solution is applied to the resist substrate 8 while it is rotated by a spinner. It is possible to perform the development step at a high efficiency and at a low cost by adjusting the time of immersion in, or application of, the alkali developing solution if the inorganic resist layer 3 has a great thickness. Development may also be performed by immersing the resist substrate 8 in the alkali developing solution with the application of ultrasonic waves to improve the uniformity of etching.

Examples of the alkali developing solution include an organic alkali developing solution such as a tetramethylammonium hydroxide solution and an inorganic alkali developing solution such as a potassium hydroxide (KOH) solution, a sodium hydroxide (NaOH) solution, and a phosphoric acid solution.

The development time in the development step for forming a high-density optical disc master is about 10 to 30 minutes. The inorganic resist layer 3 for forming a low-density optical disc master is formed to have a thickness that is greater than the thickness of the inorganic resist layer 3 for forming a high-density optical disc master. Therefore, the development time in the development step for forming a low-density optical disc master is 1.5 times to twice the development time in the development step for forming a high-density optical disc master.

In the embodiment, a positive inorganic resist layer 3 made of a product of incomplete oxidation of tungsten (W) is used, and the etching rate for the unexposed portions 3b is thus lower than the etching rate for the exposed portions 3a. Therefore, the exposed portions 3a of the inorganic resist layer 3 are removed so that portions of the surface of the intermediate layer 2 that are located below the exposed portions 3a are exposed.

After the development step, the resist substrate 8 is washed sufficiently and dried by centrifugal drying through high-speed rotation.

An optical disc master 9 is produced through the steps described above. In the case where a low-density optical disc master has been formed, the minimum pit size is 0.4 (μm)× 0.37 (μm). In the case where an optical disc master conforming to the BD standard has been formed as a high-density optical disc master, the minimum pit size is 0.15 (μm)×0.16 (μm). The concave-convex pattern including pits and grooves formed on the optical disc master in accordance with the embodiment has precisely formed edges.

The concave-convex pattern formed on the optical disc master 9 fabricated in accordance with the embodiment is formed using the inorganic resist layer 3. The concave-convex pattern formed in accordance with the related art by irradiating an organic resist layer with a laser beam to cause a photochemical reaction is affected by the molecular size because the concave-convex pattern is formed by chemical bonding, and thus side surfaces of grooves in the concave-convex pattern extend meanderingly. In the embodiment where the inorganic resist layer 3 is used, in comparison, the inorganic resist layer 3 is exposed through thermal recording using the laser beam L. Therefore, the boundary between the exposed portions 3a and the unexposed portions 3b of the inorganic resist layer 3 is clearly defined, and thus side surfaces of grooves in the concave-convex pattern formed on the optical disc master 9 are formed to be smooth. In the case where the concave-convex pattern formed using an organic resist layer in accordance with the related art includes a sharply bent groove, the corner of the sharply bent portion may be formed not in a predetermined shape but to be more or less rounded. In the embodiment, in comparison, a concave-convex pattern including grooves in a desired shape is formed without the influence of the molecular size. Consequently, a concave-convex pattern is formed precisely in the embodiment where the inorganic resist layer 3 is used, making it possible to secure a margin in compliance with the standard.

That is, because a product of incomplete oxidation of a transition metal with a small molecular size is used as a resist material in the embodiment, a good edge pattern is obtained and precise patterning is enabled.

Figure 2F:
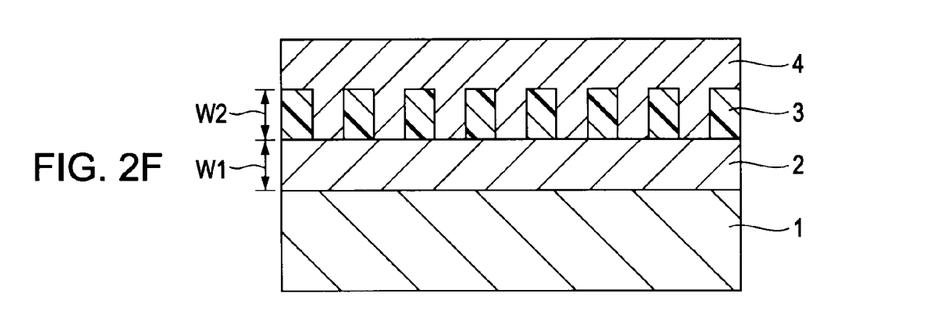
FIG. 2F shows a sixth step of the production method for an optical disc master and an optical disc according to the embodiment of the present invention.

Then, as shown in FIG. 2F, a metallic film 4 is deposited over the surface of the concave-convex pattern of the optical disc master 9 by electroforming. A mold release treatment may be performed on the surface of the inorganic resist layer 3 of the optical disc master 9 to improve the mold releasability as necessary before the electroforming step.

Figure 3G:
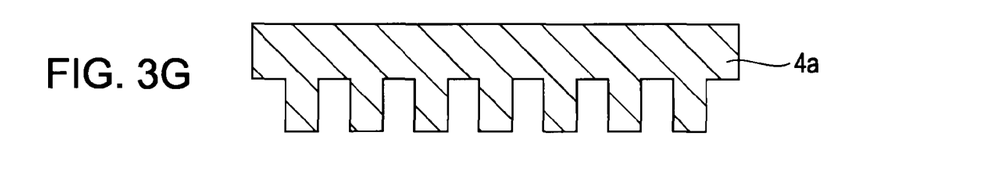
FIG. 3G shows a seventh step of the production method for an optical disc master and an optical disc according to the embodiment of the present invention.

In the embodiment, a metallic nickel film is deposited over the surface of the concave-convex pattern of the optical disc master 9, for example. After the electroforming step, the deposited metallic film 4 is peeled from the optical disc master 9, obtaining a molding stamper 4a to which the concave-convex pattern of the optical disc master 9 has been transferred as shown in FIG. 3G. After the molding stamper 4a is formed, the optical disc master 9 is washed with water, dried, and kept in storage. The optical disc master 9 may be repeatedly used to fabricate a desired number of molding stampers 4a as necessary.

Electroforming and peeling steps may be performed using the molding stamper 4a, which is formed by peeling from the optical disc master 9, as a master to fabricate a mother master having the same concave-convex pattern as the concave-convex pattern of the optical disc master 9. Further electroforming and peeling steps may be performed using the mother master to fabricate a stamper having the same concave-convex pattern as the concave-convex pattern of the molding stamper 4a.

Figure 3H:
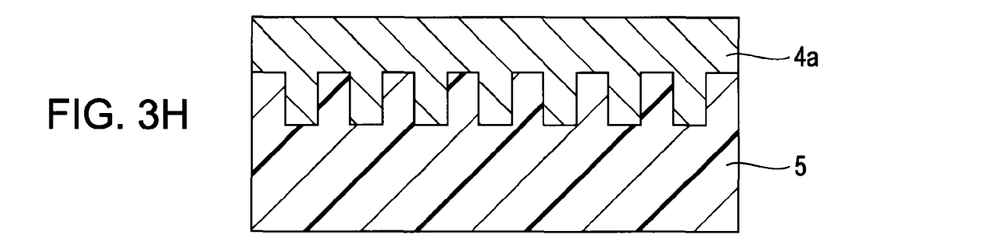
FIG. 3H shows an eighth step of the production method for an optical disc master and an optical disc according to the embodiment of the present invention.
Figure 3I:
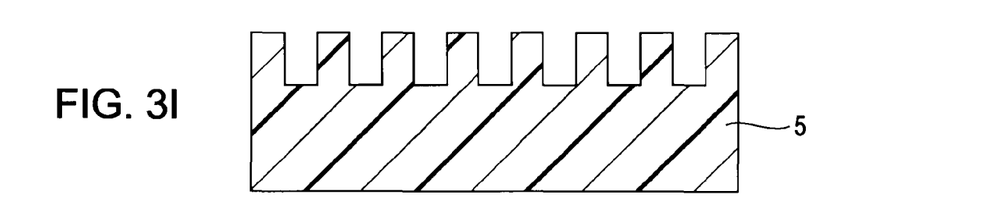
FIG. 3I shows a ninth step of the production method for an optical disc master and an optical disc according to the embodiment of the present invention.
Figure 3J:
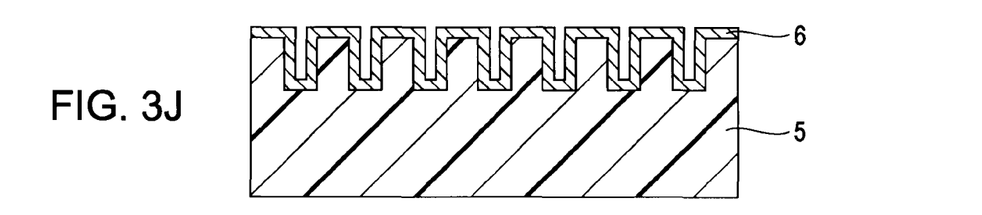
FIG. 3J shows a tenth step of the production method for an optical disc master and an optical disc according to the embodiment of the present invention.
Figure 3K:
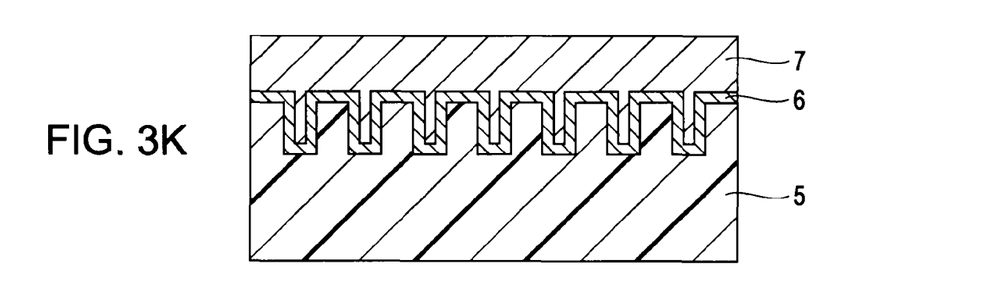
FIG. 3K shows an eleventh step of the production method for an optical disc master and an optical disc according to the embodiment of the present invention.

Then, as shown in FIG. 3H, a resin disc substrate 5 is formed by injection molding using the molding stamper 4a. The disc substrate 5 is made of polycarbonate which is a thermosetting resin. The disc substrate 5 to which the concave-convex pattern formed on the molding stamper 4a has been transferred is thus formed. Then, the molding stamper 4a is peeled as shown in FIG. 3I, and a reflective film 6 made of an Al alloy is formed over the surface of the concave-convex pattern of the disc substrate 5 as shown in FIG. 3J. Then, as shown in FIG. 3K, a protective film 7 is formed to cover the reflective film 6, completing an optical disc with a diameter of 12 cm.

According to the present invention, it is possible to form an optical disc master having a concave-convex pattern with a good edge pattern using the inorganic resist layer 3 as a resist layer, and to form a high-precision optical disc with pits and grooves with a good edge pattern using the optical disc master. According to the present invention, the ratio W1:W2 of the thickness W1 of the intermediate layer 2 to the thickness W2 of the inorganic resist layer 3 is between 0.8:1 and 1.2:1 in the case of forming a high-density optical disc master, and between 1.1:1 and 1.5:1 in the case of forming a low-density optical disc master.

Consequently, it is possible to form a high-density optical disc master for use in the production of high-density optical discs such as BDs and a low-density optical disc master for use in the production of low-density optical discs such as CDs and DVDs through the same steps. It is possible to expose the two types of optical disc masters with the same exposure apparatus without changing the specifications of the exposure apparatus. Since a low-density optical disc master and a high-density optical disc master may be fabricated with the same exposure apparatus, it is possible to reduce the production cost.

The present application contains subject matter related to that disclosed in Japanese Priority Patent Application JP 2008-291452 filed in the Japan Patent Office on Nov. 13, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A production method for an optical disc master, comprising the steps of:
   preparing a substrate;
   forming an intermediate layer having a predetermined thickness on the substrate;
   forming an inorganic resist layer having a thickness on the intermediate layer, a ratio of the thickness of the intermediate layer to the thickness of the inorganic resist layer being in a range between 0.8:1 and 1.2:1 when the optical disc master is a high-density optical disc master;
   irradiating the inorganic resist layer with a laser beam to selectively expose the inorganic resist layer, the laser beam irradiating the inorganic resist layer having a same wavelength when the optical disc master is a low-density optical disc master and when the optical disc master is a high-density optical disc master; and
   developing the selectively exposed inorganic resist layer.

2. The production method for an optical disc master according to claim 1, wherein the thickness of the inorganic resist layer is 50 nm to 150 nm.

3. An optical disc master having a concave-convex pattern formed by the steps of:
   forming an intermediate layer having a predetermined thickness on a substrate;
   forming an inorganic resist layer having a thickness on the intermediate layer, a ratio of the thickness of the intermediate layer to the thickness of the inorganic resist layer being in a range between 0.8:1 and 1.2:1 when the optical disc master is a high-density optical disc master;
   irradiating the inorganic resist layer with a laser beam to selectively expose the inorganic resist layer, the laser beam irradiating the inorganic resist layer having a same wavelength when the optical disc master is a low-density optical disc master and when the optical disc master is a high-density optical disc master; and
   developing the selectively exposed inorganic resist layer.

4. A stamper formed from an optical disc master by the steps of:
   forming an intermediate layer having a predetermined thickness on a substrate;
   forming an inorganic resist layer having a thickness on the intermediate layer, a ratio of the thickness of the intermediate layer to the thickness of the inorganic resist layer being in a range between 0.8:1 and 1.2:1 when the optical disc master is a high-density optical disc master;
   irradiating the inorganic resist layer with a laser beam to selectively expose the inorganic resist layer, the laser beam irradiating the inorganic resist layer having a same wavelength when the optical disc master is a low-density optical disc master and when the optical disc master is a high-density optical disc master;
   developing the selectively exposed inorganic resist layer to form the optical disc master having a desired concave-convex pattern;
   forming a film of a stamper material on the concave-convex pattern of the optical disc master; and
   peeling the stamper material to which the concave-convex pattern has been transferred from the optical disc master.

5. An optical disc formed from an optical disc master by the steps of:
   forming an intermediate layer having a predetermined thickness on a substrate;
   forming an inorganic resist layer having a thickness on the intermediate layer, a ratio of the thickness of the intermediate layer to the thickness of the inorganic resist layer being in a range between 0.8:1 and 1.2:1 when the optical disc master is a high-density optical disc master;
   irradiating the inorganic resist layer with a laser beam to selectively expose the inorganic resist layer, the laser beam irradiating the inorganic resist layer having a same wavelength when the optical disc master is a low-density optical disc master and when the optical disc master is a high-density optical disc master;
   developing the selectively exposed inorganic resist layer to form the optical disc master having a desired concave-convex pattern;
   forming a film of a stamper material on the concave-convex pattern of the optical disc master;
   peeling the stamper material to which the concave-convex pattern has been transferred from the optical disc master to form a stamper; and
   transferring the concave-convex pattern formed on the stamper to a disc substrate.

6. The production method according to claim 1, wherein the ratio of the thickness of the intermediate layer to the thickness of the inorganic resist layer is in a range between 1.1:1 and 1.5:1 when the optical disc master is a low-density optical disc master.

7. The optical disc master according to claim 3, wherein the ratio of the thickness of the intermediate layer to the thickness of the inorganic resist layer is in a range between 1.1:1 and 1.5:1 when the optical disc master is a low-density optical disc master.

8. The stamper according to claim 4, wherein the ratio of the thickness of the intermediate layer to the thickness of the inorganic resist layer is in a range between 1.1:1 and 1.5:1 when the optical disc master is a low-density optical disc master.

9. The optical disc according to claim 5, wherein the ratio of the thickness of the intermediate layer to the thickness of the inorganic resist layer is in a range between 1.1:1 and 1.5:1 when the optical disc master is a low-density optical disc master.

10. The production method according to claim 1, wherein the high-density optical disc master has a capacity of approximately 25 GB per side having a diameter of 12 cm and the low-density optical disc master has a capacity of 4.7 GB per side having a diameter of 12 cm.

11. The optical disc master according to claim 3, wherein the high-density optical disc master has a capacity of approximately 25 GB per side having a diameter of 12 cm and the low-density optical disc master has a capacity of 4.7 GB per side having a diameter of 12 cm.

12. The stamper according to claim 4, wherein the high-density optical disc master has a capacity of approximately 25 GB per side having a diameter of 12 cm and the low-density optical disc master has a capacity of 4.7 GB per side having a diameter of 12 cm.

13. The optical disc according to claim 5, wherein the high-density optical disc master has a capacity of approximately 25 GB per side having a diameter of 12 cm and the low-density optical disc master has a capacity of 4.7 GB per side having a diameter of 12 cm.

* * * * *